United States Patent
Lee et al.

(10) Patent No.: US 11,830,551 B2
(45) Date of Patent: *Nov. 28, 2023

(54) MEMORY PLANE ACCESS MANAGEMENT

(71) Applicant: Micron Technology, Inc., Boise, ID (US)

(72) Inventors: Eric N. Lee, San Jose, CA (US); Robert W. Strong, Folsom, CA (US); William Akin, Morgan Hill, CA (US); Jeremy Binfet, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/984,916

(22) Filed: Nov. 10, 2022

(65) Prior Publication Data

US 2023/0070445 A1 Mar. 9, 2023

Related U.S. Application Data

(63) Continuation of application No. 17/458,840, filed on Aug. 27, 2021, now Pat. No. 11,568,933.

(51) Int. Cl.
*G11C 16/22* (2006.01)
*G11C 16/04* (2006.01)
*G11C 16/24* (2006.01)
*G11C 16/34* (2006.01)
*G11C 16/30* (2006.01)

(52) U.S. Cl.
CPC .......... *G11C 16/0433* (2013.01); *G11C 16/22* (2013.01); *G11C 16/24* (2013.01); *G11C 16/30* (2013.01); *G11C 16/3404* (2013.01)

(58) Field of Classification Search
CPC ..... G11C 16/0433; G11C 16/22; G11C 16/24; G11C 16/30; G11C 16/3404; G11C 16/08; G11C 16/0483
See application file for complete search history.

(56) References Cited

U.S. PATENT DOCUMENTS

| | | | |
|---|---|---|---|
| 8,504,670 B2 * | 8/2013 | Wu | G06F 16/188 709/213 |
| 11,133,074 B1 | 9/2021 | Li et al. | |
| 11,568,933 B1 * | 1/2023 | Lee | G11C 16/3404 |
| 2014/0231954 A1 | 8/2014 | Lue | |
| 2016/0179386 A1 | 6/2016 | Zhang | |

FOREIGN PATENT DOCUMENTS

WO 2017074570 A1 5/2017

OTHER PUBLICATIONS

Choudhuri, et al., "Performance Improvement of Block Based NAND Flash Translation Layer", retrieved from https://www.ics.uci.edu/~givargis/pubs/C32.pdf., Sep. 30-Oct. 3, 2007, 6 pages.

* cited by examiner

*Primary Examiner* — Jay W. Radke
(74) *Attorney, Agent, or Firm* — Brooks, Cameron & Huebsch, PLLC

(57) ABSTRACT

A method includes identifying a target plane in respective planes of a memory die in a non-volatile memory array and identifying, from blocks of non-volatile memory cells coupled to a common bit line in the target plane, at least one target block in the target plane. The method further includes performing an operation to disable at least one gate associated with the at least one target block to prevent access to the blocks of non-volatile memory cells coupled to the common bit line in the target plane.

20 Claims, 6 Drawing Sheets

MEMORY PLANE ACCESS MANAGEMENT

PRIORITY INFORMATION

This application is a Continuation of U.S. application Ser. No. 17/458,840, filed Aug. 27, 2021, contents of which are incorporated herein by reference.

TECHNICAL FIELD

Embodiments of the disclosure relate generally to memory sub-systems, and more specifically, relate to memory plane access management.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
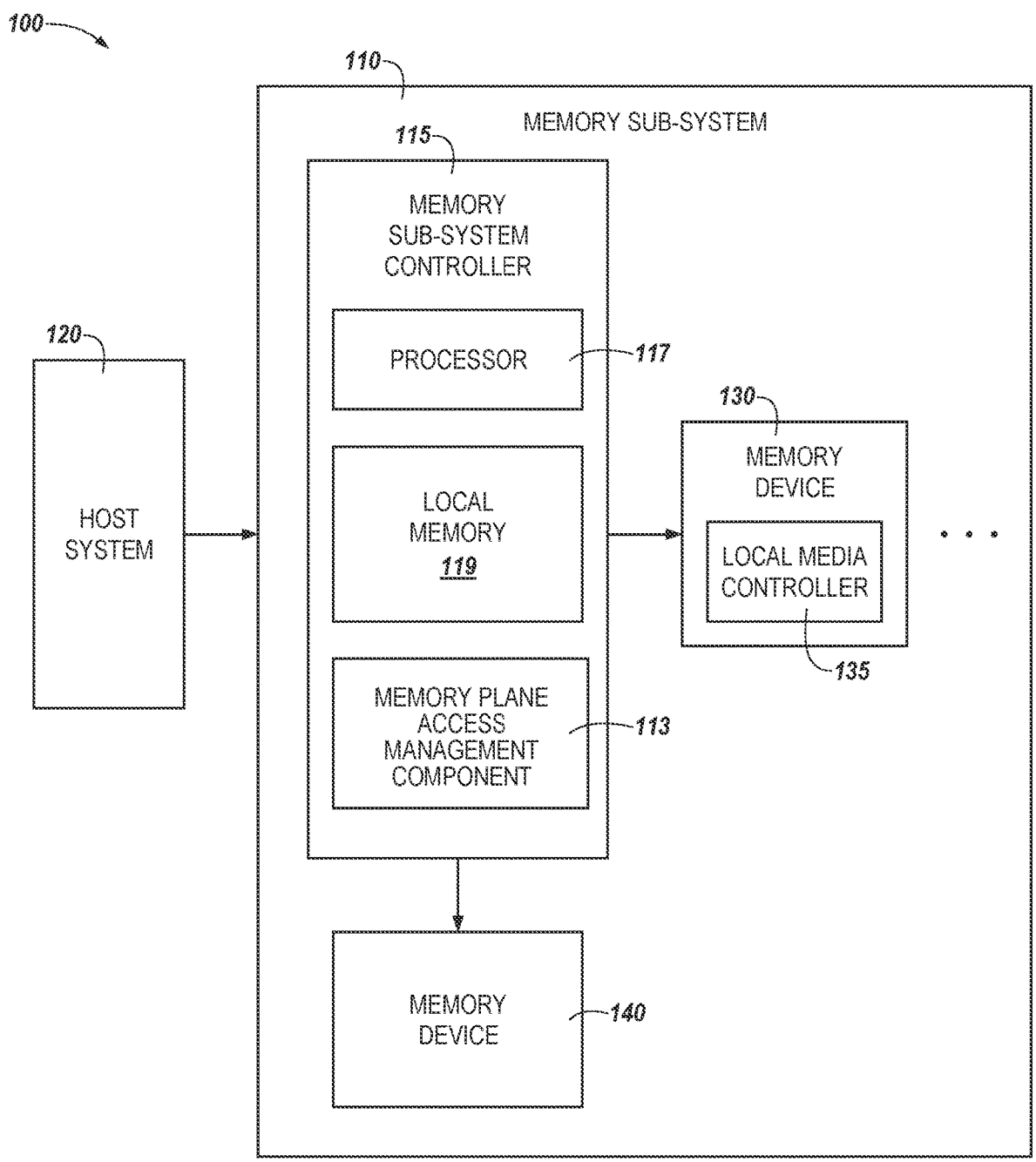
FIG. 1 illustrates an example computing system that includes a memory sub-system in accordance with some embodiments of the present disclosure.

Aspects of the present disclosure are directed to memory plane access management, in particular to memory sub-systems that include a memory plane access management component. A memory sub-system can be a storage device, a memory module, or a hybrid of a storage device and memory module. An example of a memory sub-system is a storage system, such as a solid state drive (SDD). Examples of storage devices and memory modules are described below in conjunction with FIG. 1. In general, a host system can utilize a memory sub-system that includes one or more components, such as "memory devices" that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Performance of a NAND memory device can be determined by the program speed of the NAND memory device. That is, the speed at which it takes to program the pages of a NAND memory device. Systems can improve performance by grouping multiple NAND pages together in order to program the NAND pages concurrently. For instance, superblocks can be formed to increase system performance. A superblock, as used herein, can refer to a set of blocks that span multiple die that are written in an interleaved fashion. In some cases, a superblock may span all the die within an SSD. A superblock may contain multiple blocks from a single die. A superblock may be a unit of management within the SSD.

Protecting data on a non-volatile memory device such as a NAND memory device from any unintended or nefarious use is desired in various instances. For instance, it may be desirable to protect data on a non-volatile memory device during transit along a supply chain (e.g., between a manufacturer, a distributor, and/or an end-user), during an operational lifetime of the non-volatile memory device, and/or at the end of an operational lifetime of the non-volatile memory device.

Some efforts to protect data rely on physical destruction of the non-volatile memory device and/or erasing the data. Physical destruction renders the non-volatile memory device no longer reliable for storing and retrieving data by way of physical damage. Yet, physical destruction may not always be permissible or desired. For instance, physical destruction of a stolen or lost device may not be possible. Moreover, physical destruction is irreversible and therefore any further use of the non-volatile memory device is not possible once physically destroyed. In addition, physical destruction of a non-volatile memory device can have undesirable environmental impacts if not disposed of in an environmentally friendly manner.

As such, other approaches can perform an erase operation (e.g., a block erase) in an effort to erase and thereby protect (or at least render inaccessible) any data on the non-volatile memory device from an unintended access of the data. However, performance of an erase operation may be time-consuming and/or may not always be successful in erasing the data. As a result of being time-consuming and/or not successfully erasing the data, the data on the non-volatile memory device can remain accessible for an amount of time sufficient for an unauthorized and/or nefarious entity to gain access to the data. Moreover, an erase operation traditionally requires some initiation event and therefore does not initially or as a default protect data on the non-volatile memory device. For instance, data (e.g., manufacturer specific data) on the non-volatile memory device can be vulnerable to attack and/or corruption during transit along a supply chain.

Aspects of the present disclosure address the above and other deficiencies by allowing for performance of memory plane access management. Memory plane access management can include identifying a target plane of a memory die in a non-volatile memory device, identifying, from blocks of non-volatile memory cells coupled to a common bit line in the target plane, at least one target block, and performing an operation to prevent access to the target plane. For instance, at least one gate associated with the at least one target block can be disabled, as detailed herein, to prevent access to each of the blocks of non-volatile memory cells coupled to the common bit line in the target plane.

Preventing access can include preventing read, write, and/or erase access to each of the blocks of non-volatile memory cells coupled to the common bit line in the target plane. In some embodiments, preventing access can include preventing read access (e.g., preventing at least read access) to each of the blocks of non-volatile memory cells coupled to the common bit line in the target plane, as detailed herein.

Use of memory plane access management (e.g., preventing access to at least one target plane) provides additional benefits to non-volatile memory devices in a number of ways. For example, with memory plane access management, other planes (other than the target plane) can remain enabled. For instance, sensitive data (e.g., manufacture specific data and/or confidential data) can be stored on a target plane, while other data can be stored on a different plane than the target plane. In such an example, memory plane access management can prevent access to the target plane, and yet access (e.g., read access) can be permitted on the different plane.

Further, memory plane access management can occur in the absence of signaling indicative of an erase operation to ensure that access to any data on the memory sub-system is timely prevented, as compared to other approaches that do not employ memory plane access management, such as those that may instead attempt to prevent access to the data by performing a time-consuming erase operation (e.g., a block erase) of any data on the non-volatile memory array. Stated differently, in some embodiments an erase operation is not performed on any of the blocks of non-volatile memory cells in at least a target plane substantially concurrently with or prior to performance of memory plane access management. That is, memory plane access management can prevent access to each block of the blocks of non-volatile memory cells coupled to the common bit line in the target plane by performing an operation on at least one gate associated with the at least one target block in the target plane. For instance, the operation on at least one gate associated with the at least one target block in the target plane can be performed on some but not all of the blocks of non-volatile memory cells in the target plane, in contrast to other time-consuming approaches such as those the attempt to erase data on each individual block in a given plane and/or each individual block in a given memory die. Memory plane access management can, in contrast to other approaches such as those that employ physical destruction and/or time-consuming erase operations instead timely prevent access to any data in the target plane, as detailed herein with respect to FIG. 2A and FIG. 2B.

Further still, memory plane access management can, in some embodiments, be employed to prevent access (e.g., not permit read access) to non-volatile memory cells in a target plane, and yet subsequent access to the non-volatile memory cells in a target plane can be reenabled. For instance, non-volatile memory cells in a target plane in a lost/stolen device can be reenabled when the lost/stolen device is recovered, among other possibilities.

In some embodiments, memory plane access management can perform an operation to reenable a disabled plane responsive to receipt of signaling indicative of a vendor specific access code. For instance, a pin, an input sequence, and/or other form of code that is specific to the vendor of a non-volatile memory device can be provided to a non-volatile memory device to permit a disabled plane to be reenabled.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include various combinations of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) includes negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes a memory plane access management component 113. Although not shown in FIG. 1 so as to not obfuscate the drawings, the memory plane access management component 113 can include various circuitry to facilitate identifying a target plane in respective planes of a memory die, identifying, from blocks of non-volatile memory cells coupled to a common bit line in the target plane, at least one target block in the target plane, and performing an operation to prevent access to the blocks of non-volatile memory cells coupled to the common bit line in the target plane. In some embodiments, the memory plane access management component 113 can perform an operation to disable at least one gate associated with the at least one target block to prevent access to the blocks of non-volatile memory cells coupled to the common bit line in the target plane. Notably, performing an operation to disable a gate associated with a target block can effectively prevent access to each of the blocks of non-volatile memory cells coupled to the common bit line in the target plane without having to directly perform an operation on each of the other gates associated with the other blocks. As such, employing memory plane access management, as detailed herein, can thereby provide a quicker, more efficient mechanism to secure the data in each blocks of non-volatile memory cells in the target plane as compared to other approaches such as those that attempt to erase data (e.g., by performing a block erase) on each block in a plane and/or a memory die. Moreover, memory plane access management is selective to the target plane, and notably does not impact other planes in a memory die in which the target plane is included, as detailed herein.

In some embodiments, the memory plane access management component 113 can include special purpose circuitry in the form of an ASIC, FPGA, state machine, and/or other logic circuitry or software and/or firmware that can allow the memory plane access management component 113 to orchestrate and/or perform memory plane access management for the memory device 130 and/or the memory device 140.

In some embodiments, the memory sub-system controller 115 includes at least a portion of the memory plane access management component 113. For example, the memory sub-system controller 115 can include a processor 117 (processing device) configured to execute instructions stored in local memory 119 for performing the operations described herein. In some embodiments, the memory plane access management component 113 is part of the host system 110 (not illustrated), an application, or an operating system. In some embodiments, the memory device 130, the memory device 140, or both, includes at least a portion of the memory access management component 113.

In a non-limiting example, an apparatus (e.g., the computing system 100) can include a memory plane access management component 113. The memory plane access management component 113 can be resident on the memory sub-system 110. As used herein, the term "resident on" refers to something that is physically located on a particular component. For example, the memory plane access management component 113 being "resident on" the memory sub-system 110 refers to a condition in which the hardware circuitry that comprises the memory plane access management component 113 is physically located on the memory sub-system 110. The term "resident on" can be used interchangeably with other terms such as "deployed on" or "located on," as referred to herein.

The memory plane access management component 113 can be configured to identify a target plane in respective planes of a memory die in a non-volatile memory device. For instance, the memory plane access management component 113 can identify a target plane in respective planes of a memory die in a NAND memory device that includes a plurality of blocks of NAND memory cells. In some embodiments, the plurality of blocks of NAND memory cells can be superblocks. A superblock generally refers to a set of data blocks that span multiple memory dices that are written in interleaved fashion. As used herein, the terms "block," "block of memory cells," and/or "interleaved NAND memory blocks," as well as variants thereof, can, given the context of the disclosure, be used interchangeably.

In some embodiments, the memory plane access management component 113 can determine that a block in a plane of the respective planes includes a certain type of data. For instance, the memory plane access management component 113 can determine that a block in a plane includes confidential data and/or manufacture specific data. A status of a flag, a value stored in a bit, a value stored in a table or other data-storage structure, and/or any other type of indicator can indicate the type of data stored in the block. In some embodiments, a target plane and/or a target block can be selected based a type of data stored in a plane and/or a block. For instance, a plane including at least on block which stores confidential data and/or manufacturer specific data can be selected as a target plane, among other possibilities.

In some embodiments, an initial (i.e., default) configuration of a non-volatile memory device may prevent access to blocks of non-volatile memory cells coupled to a common bit line in a target plane. For instance, a non-volatile memory device may have at least one gate associated with the at least one target block that is disabled as an initial configuration. Thereby access to data (e.g., confidential and/or manufacturer specific data) stored in blocks of non-volatile memory cells included in the target plane is prevented as an initial configuration which can, for instance, protect the data during transit in a supply chain.

However, in some embodiments, access to a target plane can be prevented responsive to an input, a change in a condition of the memory device, or otherwise triggered. For instance, aspects of memory plane access management such as selecting a target block can be performed responsive to an input such as an input indicating a device including a non-volatile memory array is lost/stolen. For instance, a remote "kill switch" can be triggered responsive to a device being reported lost/stolen and corresponding signaling can be sent to the lost/stolen device (e.g., via a wireless signal) to initiate memory plane access management and thereby prevent access to blocks of non-volatile memory cells coupled to a common bit line in a target plane. In such instances, employing memory plane access management can timely and effectively secure data on the lost/stolen device, in contrast to other approaches that do not employ memory plane access management such as those which instead attempt to erase any data on the lost/stolen device (e.g., via a block erase).

In some embodiments, a target plane can have access to the target plane reenabled. As mentioned, memory plane access management can reenable access to a target plane (a disabled target plane) responsive to input or receipt of signaling indicative of a manufacturer specific code, for example.

Figure 2A:
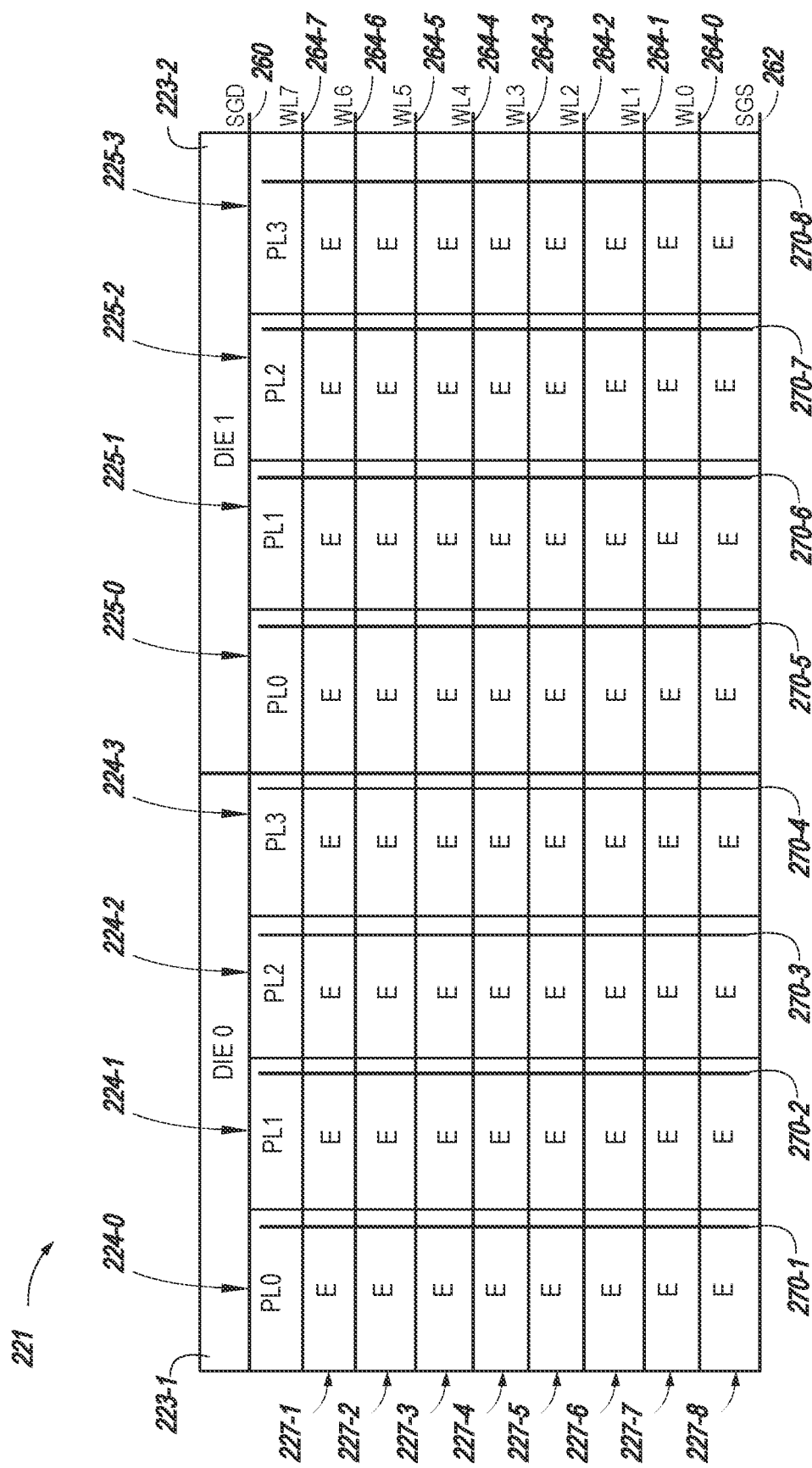
FIG. 2A illustrates an example of a non-volatile memory array in accordance with some embodiments of the present disclosure.
Figure 2B:
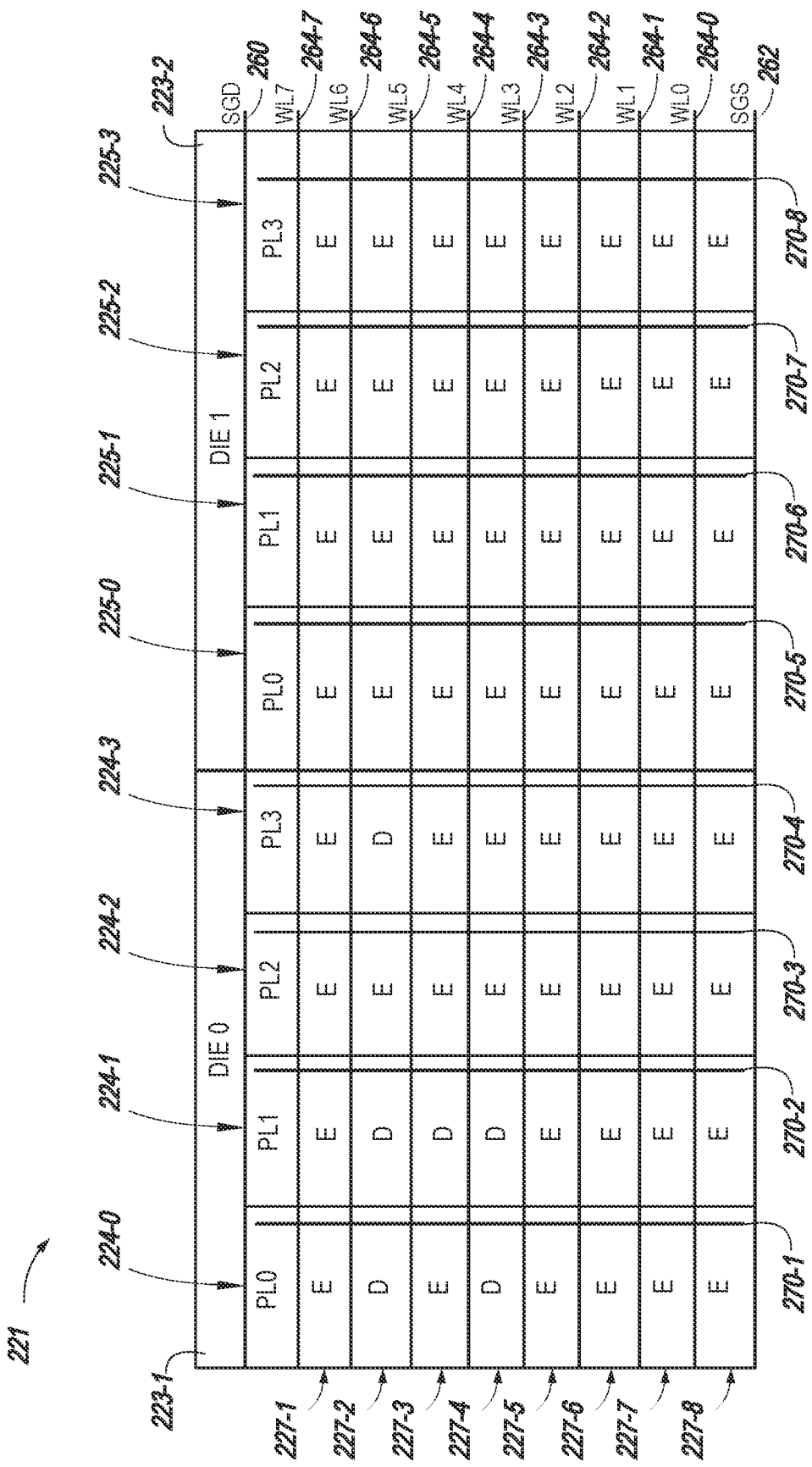
FIG. 2B illustrates another example of a non-volatile memory array in accordance with some embodiments of the present disclosure.

FIG. 2A illustrates an example of a non-volatile memory array 221 in accordance with some embodiments of the present disclosure. FIG. 2B illustrates another example of a non-volatile memory array 221 in accordance with some embodiments of the present disclosure. In some embodiments, the non-volatile memory array 221 can be a NAND memory array. In some embodiments, the non-volatile memory array 221 can be resident on a mobile computing device such as a smartphone, laptop, phablet, Internet-of-Things device, autonomous vehicle, or the like. As used herein, the term "mobile computing device" generally refers to a handheld computing device that has a slate or phablet form factor. In general, a slate form factor can include a display screen that is between approximately 3 inches and 5.2 inches (measured diagonally), while a phablet form factor can include a display screen that is between approximately 5.2 inches and 7 inches (measured diagonally). Examples of "mobile computing devices" are not so limited, however, and in some embodiments, a "mobile computing device" can refer to an IoT device, among other types of edge computing devices.

The non-volatile memory array 221 can include a number of memory dies ("DIE 0") 223-1 and ("DIE 1") 223-2 (hereinafter referred to as a number of dies 223). While illustrated as including two dies 223-1 and 223-2, the number of dies can be increased or decreased. For instance, a number of dies 223 can be equal to two dies, three dies, or four dies, among other possible number of dies.

The number of dies 223 can include a number of planes including a first plane 224-0, a second plane 224-1, a third plane 224-2, and a fourth plane 224-3 (collectively referred to herein as "planes 224") (e.g., "PL0", "PL1", "PL2" to "PL3" of "DIE 0" 223-1) and a first plane 225-0, a second plane 225-1, a third plane 225-2, and a fourth plane 225-3 (collectively referred to herein as "planes 225") (e.g., "PL0", "PL1", "PL2", to "PL3" of "DIE 1" 223-2). The number of planes can be increased or decreased.

The planes 224, 225 can include a quantity of blocks of NAND memory cells (i.e., superblocks) 227-1, 227-2, 227-3, 227-4, 227-5, 227-6, 227-7 to 227-8 (hereinafter referred to collectively as superblocks 227). Each of the respective blocks of the superblocks 227 can be referred to as an enabled block as represented by ("E") or a disabled block as represented by ("D").

The blocks in the planes 224, 225 can be arranged in strings. For instance, strings of blocks of NAND memory cells can be arranged along a common bit line with select gate transistors coupled at each end (e.g., source, drain) of each string. For instance, the strings of blocks of NAND memory cells in plane 224-0 can be coupled to a common bit line 270-1 that extends between SGD 260 (e.g., select gate drain) and SGS 262 (e.g., select gate source). For ease of illustration an individual SGD 260 and an individual SGS 262 are illustrated, however, it is understood that each of the common bit lines 270-1, 270-2, 270-3, 270-4, 270-5, 270-6, 270-7, and 270-8 and/or each of the blocks in the planes 224, 225 can have a corresponding SGD 260 and a SGS 262 that is individually addressable and programmable. That is, each string can include a number of memory cells coupled in series, drain-to-source.

In some embodiments, a driver such as a string driver can be used to control selection of particular strings of memory cells and/or particular memory cells, such as by application of a voltage signal to particular select gates and/or particular memory cells within the strings of memory cells by, for instance, appropriate assertion of access lines such as word lines 264-0, 264-1, 264-2, 264-3, 264-4, 264-5, 264-6, 264-7 (hereinafter referred to collectively as word lines 264). FIG. 2A and FIG. 2B illustrate the word lines 264, select gate 260 (SGD), and select gate 262 (SGS), and common bit lines 270 of memory array 221. The word lines 264, SGD 260, SGS 262, and/or common bit lines 270 of memory array 221 can be coupled to a string driver via a number of conductive lines. The string driver can be formed using CMOS devices, for example. The memory array 221 can include additional components such as data lines (not shown) and/or additional address lines which can be arranged and coupled to the strings of memory cells. In some embodiments, the word lines 264, SGD 260, and select SGS 262 of the memory array 221 can be coupled to respective global access lines (not illustrated) through selection transistors (not illustrated). The selection transistors can be field effect transistors (FETs), for example. The selection transistors can be controlled via the block high voltage switch output (BLKHVSW_OUT) signal line, which is coupled between an output of a block high voltage switch and, for example, the gate of each of the selection transistors. The block high voltage switch receives as inputs, for example, a block selection address and an input voltage to produce the BLKHVSW_OUT signal on the block high voltage switch output signal line when appropriate to couple the word lines 264, SGD 260, SGS 262, and/or common bit lines 270 of memory array 221 to the global access lines.

In a typical operation, a voltage equal to or above a threshold voltage can be programmed into a select gate such as SGD 260 and/or SGS 262. The voltage can be maintained during normal operation of the memory array 221. For instance, the voltage can be maintained by inhibiting subsequent programming of the select gate.

Subsequent to programming the select gate, an operation (e.g., a read operation) can be performed on a block of non-volatile memory cells associated with the select gate. For instance, unselected access lines which are not coupled to memory cells being read or verified, can be provided with a pass voltage (Vpass), while the selected access line such as a selected word line 264 can be provided with a read voltage. Other techniques are possible for reading and/or programming memory cells, as will be appreciated by one of skill in the art. In any case, such techniques intend to provide a sufficient programming voltage (e.g., a voltage that is greater than a threshold voltage) to a select gate and subsequently electrically isolate a given access line during an operation to permit accessing of the electrically isolated access line associated with the programmed select gate.

Notably, memory plane access management can be performed to prevent access to a target plane, and thereby prevent access to data store in blocks of non-volatile memory cells in the target plane. For instance, an operation can be performed to disable at least one gate (e.g., reduce a voltage of a select gate to less than a threshold voltage) associated with the at least one target block in a target plane to prevent access to each of the blocks of non-volatile memory cells coupled to a common bit line in the target plane. In this way, entire planes can be selectively enabled or disabled as described in FIG. 2A and FIG. 2B, and data on the disabled planes can be protected.

An enabled plane can refer to a plane that includes a particular number of enabled blocks. These planes permit normal operation and normal access to each of the blocks in the planes or, put another way, performance that is not affected by a disabled block. For instance, gates (e.g., select gates) associated with each of the blocks of non-volatile memory cells in an enabled plane can have a respective voltage that is greater than a voltage threshold, as detailed herein. In FIG. 2A, each of the planes 224, 225 is an enabled plane. For instance, all blocks within planes 224, 225 are enabled (e.g., designated as "E") in FIG. 2A.

A disabled plane can refer to a plane with at least one disabled block (e.g., designated as "D"). Disabled planes do not permit normal access (e.g., read access) to each of the blocks in the planes or, put another way, performance that is affected by a disabled block. For instance, a gate (e.g., a select gate) associated with a target block in a disabled plane can have a respective voltage that is less than a voltage threshold, as detailed herein. As illustrated in FIG. 2B, one or more blocks (e.g., all blocks designated as "D") from planes 224 and/or planes 225 can be disabled.

As mentioned, the one or more target blocks from planes 224 and/or 225 can be disabled by performing an operation to disable at least one gate associated with the one or more target blocks. For instance, an operation can be performed to reduce a voltage of at least one gate to voltage that is less than a voltage threshold and/or that is less than a voltage employed to perform an operation (e.g., a read operation). The voltage threshold can be a particular voltage or DAC value. For instance, the voltage threshold can a read level value, etc. A read level value is a voltage or DAC value representing a voltage that is applied to the read element (often, the control/select gate for a NAND cell) for purposes of reading that cell.

The voltage threshold can be a value in a range from substantially about 1 volt to substantially about 10 volts. As used herein, the term "substantially" intends that the characteristic needs not be absolute, but is close enough so as to achieve the advantages of the characteristic. For example, "substantially about" is not limited to an absolute value, but can include similar values such as those within 10 percent, 5 percent, or 1 percent of a given value. All individual values and subranges from substantially about 1 volt to substantially about 10 volts are included. For instance, in some embodiments, the voltage threshold can be equal to about 1 volt, about 2 volts, about 4 volts, about 6 volts, about 8 volts, or about 10 volts, among other possible values. In some embodiments, the voltage threshold can be equal to 1 volt, 2 volts, 4 volts, 6 volts, 8 volts, or 10 volts, among other possible values. In some embodiments, the threshold voltage can be in a range from about 1 volt to about 10 volts, from about 1 volt to about 8 volts, from about 1 volt to about 6 volts, from about 1 volt to about 4 volts, or from about 1 volt to about 2 volts, among other possible values.

In some embodiments, performing the operation can reduce the voltage of the at least one gate to a voltage that is less than the voltage threshold. For instance, performing the operation on at least one gate can reduce a voltage of the at least one gate to be less than 1 volt, less than 2 volts, less than 4 volts, less than 6 volts, less than 8 volts, or less than 10 volts, among other possible values. In some embodiments, the gate can be a select gate transistors such as a SGD 260, a SGS 262, or both.

In some embodiments, the voltage threshold can be substantially equal to a voltage of a common bit line 270 during an operation such as a read operation or otherwise. In some embodiments, performing the operation can reduce the voltage of the at least one gate to a voltage that is substantially equal to a voltage of the common bit line 270 during an operation such as a read operation. For instance, reduction of the at least one gate to a voltage that substantially equal or less than a voltage of a common bit line 270 during an operation can create leaky or parasitic current the prevents an access (e.g., a read access) to each of the blocks of non-volatile memory cells coupled to the common bit line while the at least one gate has a voltage that substantially equal or less than a voltage of a common bit line 270 during an operation. In some embodiments, any subsequent programming of the at least one gate (subsequent to performing an operation to reduce a voltage of the at least one gate) can be inhibited to retain the at least one gate at a voltage that is less than a voltage threshold.

In some embodiments, performing the operation can reduce the voltage of the SGD 260, the SGS 262, or both, to be less than a voltage threshold. For instance, an operation can be performed to alter a voltage of a select gate source (SGS) transistor, a select gate drain (SGD) transistor, or both, to a first voltage that is less than a voltage threshold. Such reduction can prevent access to the blocks of non-volatile memory cells coupled to the SGS. In such embodiments, a subsequent operation can be performed to reenable access to each block of the plurality of blocks of non-volatile memory cells coupled to the common bit line in the target plane. For example, an operation can be performed to alter the voltage applied to the SGS 262 transistor, the SGD 260 transistor, or both, from the first voltage to a second voltage that is greater than the voltage threshold and thereby reenable access to each block of the plurality of blocks of non-volatile memory cells.

In some embodiments, performing the operation can disable access to each of the blocks of non-volatile memory cells coupled to the common bit line in the target plane. For instance, as illustrated in FIG. 2B plane 224-3 has an individual block (as represented by "D") that is disabled, yet due to disabling the at least one gate associated with the individual block, each of the other blocks which are enabled (as represented by "E") of non-volatile memory cells coupled to the common bit line 270-4 in the target plane (plane 224-3) are also effectively disabled. Without wishing to be bound by theory, it is believed that disabling the at least one gate associated with the at least one target block in the target plane, as detailed herein, causes leaky or parasitic current that interferes with aspects of performing a memory operation, such as preventing an intended degree of biasing (from application of a biasing voltage) of the common bit line in the target plane and thereby prevents access to each of the blocks of non-volatile memory cells coupled to the common bit line in the target plane.

In some embodiments, performing the operation disables access to some but not all of the respective planes in a memory die. For instance, as illustrated in FIG. 2B plane 224-0, 224-1 and 224-3 are disabled (as indicated by the presence of at least on disabled block in each respective plane), whereas plane 224-2 is enabled (as indicated by the presence of all blocks being enabled). Disabling some but not all planes can reduce a quantity of operations (e.g., those to disable the target blocks) which can reduce an amount of power consumption and/or reduce an amount of time to prevent access to the target plane, and yet can prevent access to each of the blocks of non-volatile memory cells coupled to the common bit line in the target planes which are disabled.

In some embodiments, a target plane can include a plurality of target blocks. For example, a target plane can include at least two target blocks or at least three target blocks, among other possibilities. For instance, as illustrated in FIG. 2B, the plane 224-0-2 is a target plane (as indicated by having at least one target block included in the plane) that includes two target blocks (represented by "D"). Having more than one target block in a given target plane can provide benefits such as redundancy (e.g., to ensure a voltage of at least one of the target blocks is reduced to less than a voltage threshold thereby ensuring that access to the entire target plane in prevented). For instance, having more than one target block (at least one redundant target block in addition to the target block) in a given target plane can account for any variations in cell/block programming differences and/or account for differences in physical location/proximity to other components in a memory die (e.g., proximity to an access line/particular gate) and thereby ensure that access to the entire target plane is prevented.

Figure 3:
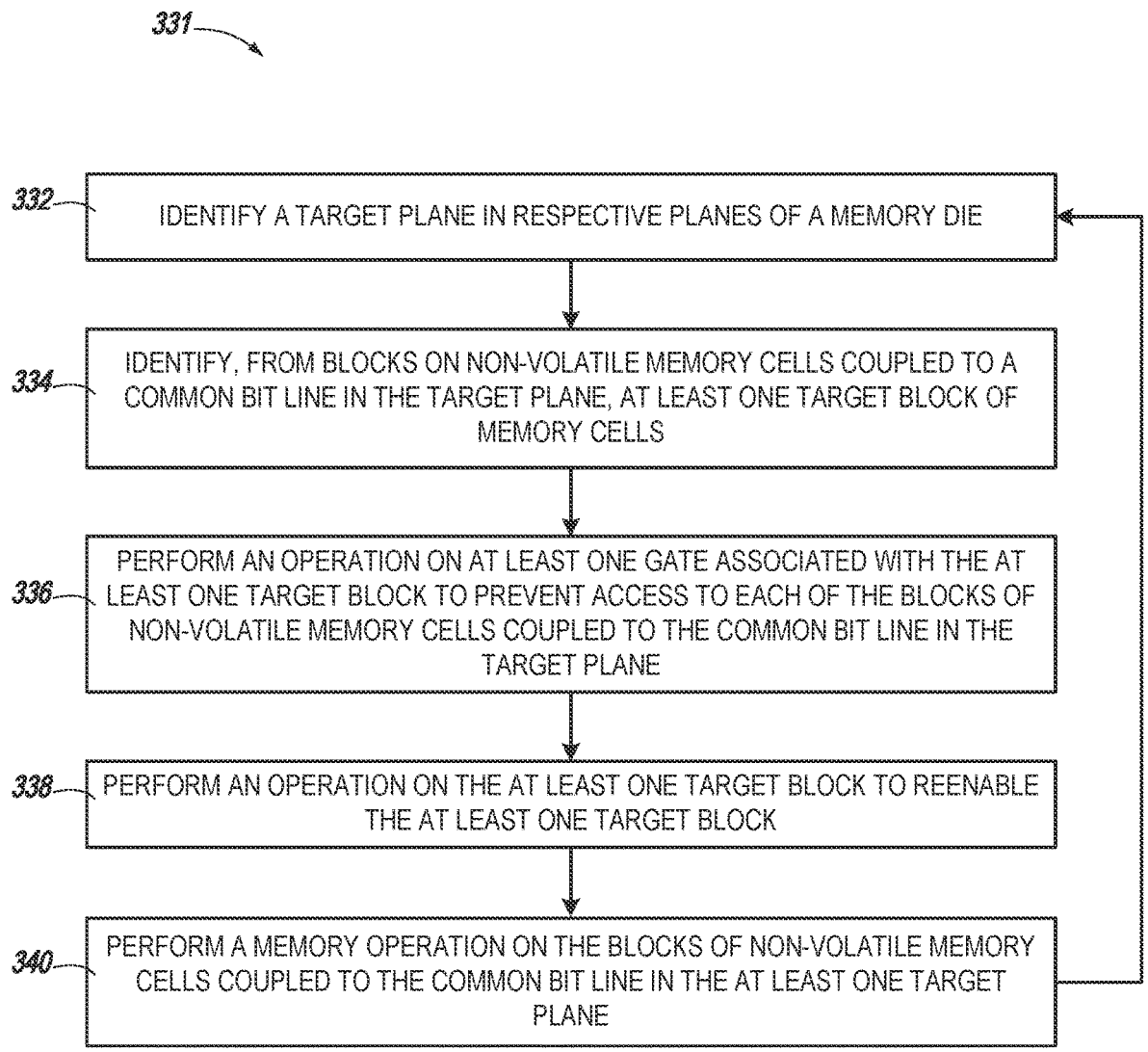
FIG. 3 illustrates an example flow diagram of memory plane access management in accordance with some embodiments of the present disclosure.

FIG. 3 illustrates an example flow diagram 331 of memory plane access management in accordance with some embodiments of the present disclosure. At operation 332, a memory plane access management component (such as memory plane access management component 113 in FIG. 1) can identify a target plane in a respective planes of a memory die, as detailed herein.

Responsive to identification of the target plane, the flow diagram 331 can proceed to operation 334. At operation 334, the memory plane access management component can identify at least one target block of non-volatile memory cells in the target plane. For instance, the memory plane access management component can identify, from blocks of non-volatile memory cells coupled to a common bit line in the target plane, at least one target block of non-volatile memory cells in the target plane.

Responsive to identification of the target block, the flow diagram 331 can proceed to operation 336. At operation 336, the memory plane access management component can perform an operation on at least one gate associated with the at least one target block to prevent access to each of the blocks of non-volatile memory cells coupled to a common bit line in the target plane. For instance, the operation can be performed to alter a voltage of the at least one gate associated with the at least one target block. In some embodiments, the operation can be performed to alter a voltage of at least one gate associated with each of a plurality of target blocks to be less than a voltage threshold, as detailed herein.

Responsive to performance of the operation on the at least one gate at operation 336, the flow diagram 331 can proceed to operation 338. At operation 338, the memory plane access management component can perform an operation to reenable access to each of the blocks of non-volatile memory cells coupled to a common bit line in the target plane (i.e., the disabled target plane). For instance, an operation can be performed on each gate associated with each target block to reenable operation of each of the at least one target blocks and thereby permit access to each of the blocks of non-volatile memory cells coupled to the common bit line in the target plane. In some embodiments, the operation can be performed directly on the at least one gate and/or an operation can be performed on a block of non-volatile memory cells in a string of memory cells that is coupled to the at least one gate. For instance, an operation can be performed directly on the at least one gate to program the at least one gate to a voltage that is greater than a voltage threshold and thereby reenable access to each of the blocks of non-volatile memory cells coupled to a common bit line in the target plane.

Responsive to performance of the operation on the at least one gate at 338, the flow diagram 331 can proceed to operation 340. At operation 340, the memory plane access management component can perform a memory operation on the blocks of non-volatile memory cells coupled to a common bit line in the at least one target plane. For instance, host data can be written to the blocks of non-volatile memory cells coupled to a common bit line in the at least one target plane. As mentioned, such disabling and subsequent reenabling of access to a target plane (e.g., when a lost device is found) can extend an operational and/or functional lifetime of a device and/or securely retain data, as compared to other approaches which do not employ memory plane access management such as those attempt to erase (e.g., via a block erase) all data on a device.

Figure 4:
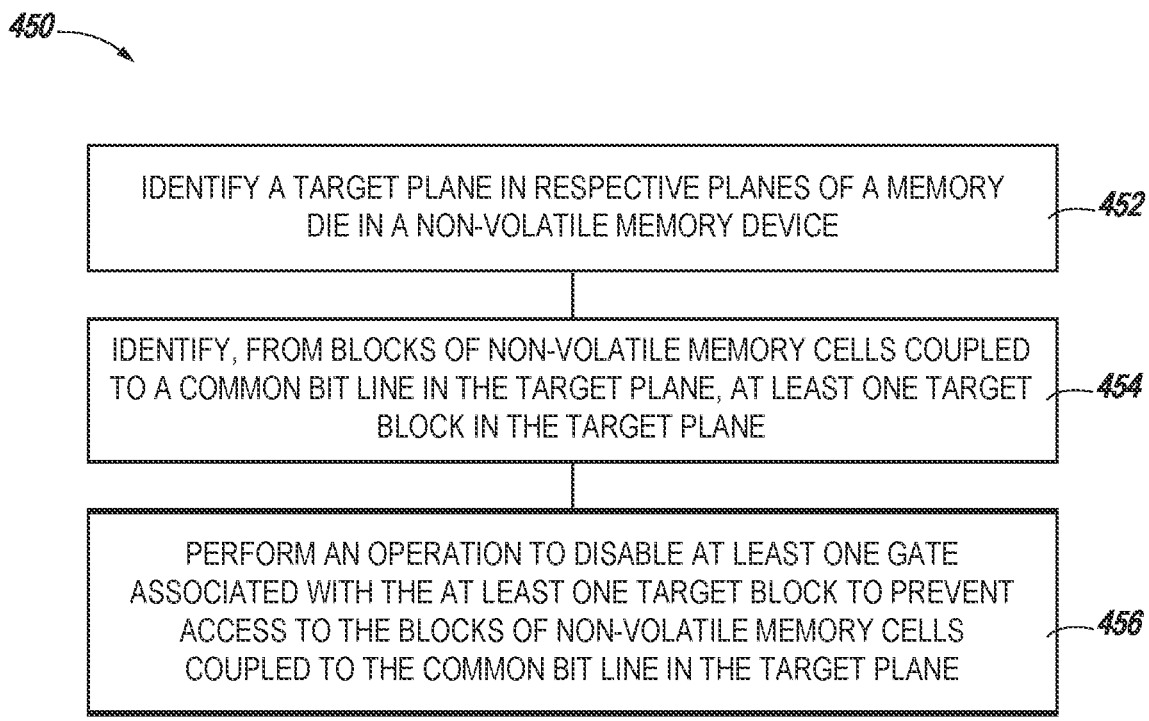
FIG. 4 illustrates an example method for memory plane access management in accordance with embodiments of the present disclosure.

FIG. 4 is a flow diagram corresponding to a method 450 for memory plane access management in accordance with some embodiments of the present disclosure. The method 450 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 450 is performed by the memory plane access management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 452, a target plane in respective planes of a memory die in a non-volatile memory device can be identified. In some embodiments, the target plane can be determined at a beginning of usage of the memory system by a user, subsequent to manufacturing testing, at a particular life cycle in the usage of the memory system, and/or in response to a system condition/input, etc. For instance, the target plane can be identified prior to native use, or use by a user. As an example, the target plane can be identified during a testing and/or manufacturing phase of a memory sub-system in which the memory device, and hence the target plane, is included.

However, in some embodiments the target plane can be identified in response to a change in system condition and/or an input. Examples of changes to a system conditions include changes to a status flag, a change in a value of a bit, and/or another type of change. The change in the system condition and/or the input can occur responsive to an event associated with a device in which the non-volatile memory device is included. For instance, in the event of the device in which the non-volatile memory device is included being stolen, a system condition (e.g., a value of a bit) can be changed and, in response, at least one target plane can be selected, among other possibilities. In this manner, the target plane can be selected and the operation to disable the target plane can be performed to timely and efficiently prevent access to data on the stolen device, as compared to other approaches that may attempt to perform the block erase operations described above to erase data on a stolen device.

At operation 454, at least one target block in the target plane can be identified. For instance, at least one target block from blocks of non-volatile memory cells coupled to a common bit line in the target plane can be identified. In some embodiments, some but not all of the blocks of non-volatile memory cells coupled to the common bit line in the target plane can be identified as target blocks. For instance, in some embodiments an individual block in the target plane can be identified as a target block.

At operation 456, an operation to disable the target block can be performed. For instance, an operation to disable at least one gate associated with the at least one target block and thereby prevent access to the blocks of non-volatile memory cells coupled to the common bit line in the target plane can be performed. In some embodiments, an operation can be performed on some but not all of the blocks of non-volatile memory cells coupled to the common bit line in the target plane. As mentioned, performance of such an operation on some but not all of the blocks of non-volatile memory cells coupled to the common bit line in the target plane can reduce a quantity of operations (e.g., those to disable access to each of the blocks in the target planes) which can reduce an amount of power consumption and/or reduce an amount of time to prevent access to the blocks in the target plane, and yet can prevent access to each of the blocks of non-volatile memory cells coupled to the common bit line in the target plane.

In some embodiments, an operation to reenable the target block can be performed. For instance, an operation to reenable at least one gate associated with the at least one target block that had be previously disabled to prevent access to the blocks of non-volatile memory cells coupled to the common bit line in the target plane can be performed. Reenabling a target block can reenable access (e.g., read, write, and/or erase access) to the blocks of non-volatile memory cells in the target plane. Thus, in some embodiments subsequent to performing the operation on the at least one target block to prevent access to the target plane, an operation can be performed on the gate associated with the at least one target block to reenable access to the at least one target block. For instance, an operation can be performed to reenable each of the gates associated with each of the at least one target blocks (or subsets of the gates associated with each of the target blocks) that had been previously disabled in a target plane and can thereby can reenable access to each (or subsets) of the blocks of non-volatile memory cells in the target plane.

In some embodiments, host data can be written to the reenabled blocks of non-volatile memory cells in the target plane. For instance, in the above example of a lost or stolen device, the lost or stolen device can be recovered and can subsequently have a target plane reenabled to permit performing a memory operation on and/or performing a host access involving data written to blocks of non-volatile memory cells in the reenabled target plane.

However, in some embodiments target block and/or a gate associated with a target block can be permanently disabled. For instance, a target block can be added to a bad block pool and thereby any subsequent access to or programming of the target block can be permanently prevented responsive to performing the operation to disable the at least one gate associated with the target block. Similarly, in some embodiments, the target block can be a dedicated block (e.g., dedicated at a point of manufacture) that is dedicated to being initially enabled and can be permanently disabled (e.g., by setting a bit, changing a flag or otherwise). Permanently disabling a target block can be desirable in various instances such as when a device in which the non-volatile memory array is included is stolen and/or when confidential data is stored on the device.

Figure 5:
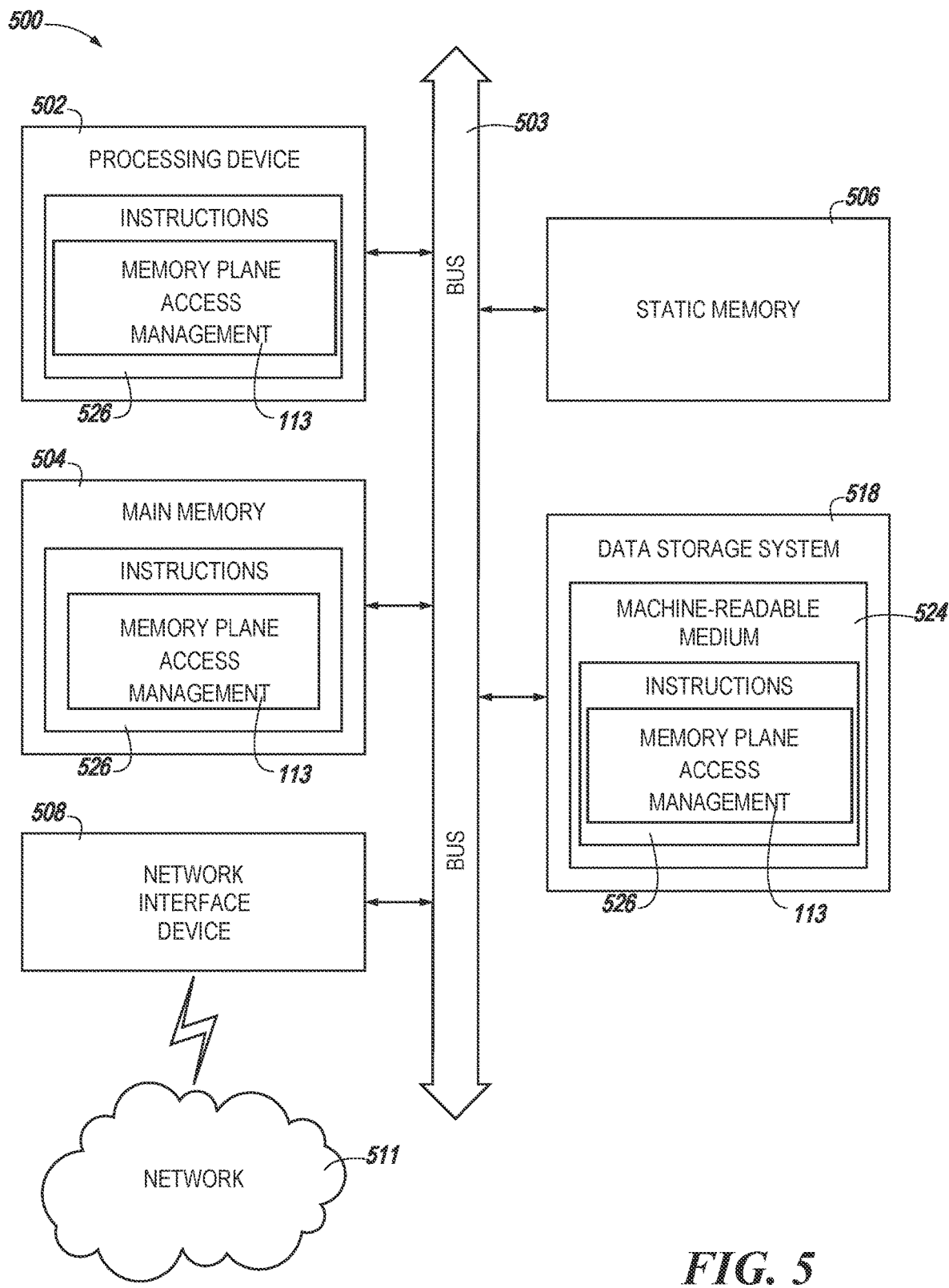
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory plane access management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 503.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 511.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a memory plane access management component (e.g., the memory plane access management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including solid state drives (SSDs), hard disk drives (HDDs), floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A non-transitory computer-readable storage medium comprising instructions that, when executed by a processing device, cause the processing device to:
   identify, from blocks of non-volatile memory cells coupled to a common bit line in a target plane included in a plurality of planes of a memory die, at least one target block in the target plane; and
   perform an operation to disable at least one gate associated with the at least one target block to prevent access to the blocks of non-volatile memory cells coupled to the common bit line in the target plane.

2. The medium of claim 1, wherein performance of the operation further comprises reducing a voltage of the at least one gate to a voltage that is less than a voltage threshold.

3. The medium of claim 2, wherein performance of the operation further comprises reducing a voltage of the at least one gate to voltage that is substantially equal to a voltage of the common bit line.

4. The medium of claim 2, wherein the voltage threshold is equal to a read value level.

5. The medium of claim 2, wherein the voltage threshold is a voltage in a range from substantially about 1 volt to substantially about 10 volts.

6. The medium of claim 1, wherein performance of the operation further comprises performance of an operation to disable access to each of the blocks of non-volatile memory cells coupled to the common bit line in the target plane.

7. The medium of claim 1, wherein performance of the operation further comprises performance of an operation to disable access to some but not all of the plurality of planes in the memory die.

8. The medium of claim 1, wherein performance of the operation further comprises performance of an operation to disable the at least one gate associated with some but not all of the blocks of non-volatile memory cells coupled to the common bit line in the target plane.

9. The medium of claim 1, wherein performance of the operation further comprises performance of an operation to disable an individual gate associated with an individual block of the blocks of non-volatile memory cells coupled to the common bit line in the target plane.

10. An apparatus, comprising:
a controller configured to:
identify, from a plurality of blocks of non-volatile memory cells coupled to a common bit line in a target plane, at least one target block in the plurality of blocks of non-volatile memory cells; and
perform an operation on at least one gate associated with the at least one target block to prevent access to each block of the plurality of blocks of non-volatile memory cells coupled to the common bit line in the target plane.

11. The apparatus of claim 10, wherein the at least one gate comprises at least one select gate.

12. The apparatus of claim 11, wherein the controller is configured to perform the operation by alteration of a voltage of a select gate source (SGS) transistor, a select gate drain (SGD) transistor, or both, to a first voltage that is less than a voltage threshold.

13. The apparatus of claim 12, wherein the controller is configured to provide signaling to reenable access to each block of the plurality of blocks of non-volatile memory cells coupled to the common bit line in the target plane.

14. The apparatus of claim 13, wherein the controller is configured to provide the signaling to reenable access by altering the voltage of SGS transistor, the SGD transistor, or both, from the first voltage to a second voltage that is greater than the voltage threshold.

15. A system, comprising:
a plurality of blocks of non-volatile memory cells; and
a controller coupled to the plurality of blocks, wherein the controller is configured to:
identify, from blocks of non-volatile memory cells coupled to a common bit line in a target plane, at least one target block of non-volatile memory cells;
perform an operation on at least one gate associated with the at least one target block to prevent access to each of the blocks of non-volatile memory cells coupled to the common bit line in the target plane;
subsequent to performing the operation on the at least one target block, perform an operation on the at least one target block to reenable access to each of the blocks of non-volatile memory cells coupled to the common bit line in the target plane; and
perform a memory operation on the blocks of non-volatile memory cells coupled to the common bit line in the target plane.

16. The system of claim 15, wherein the plurality of blocks of non-volatile memory cells are NAND memory cells associated with a NAND memory device.

17. The system of claim 15, wherein the controller is configured to perform the operation on the at least one gate associated with the at least one target block in the absence of performance of an operation on any of the other blocks of non-volatile memory cells in the target plane.

18. The system of claim 15, wherein the controller is configured to perform the operation on the at least one gate associated with the at least one target block in the absence of an erase operation on any of the blocks of non-volatile memory cells in the target plane.

19. The system of claim 15, wherein the controller is configured to:
detect initiation of a power-up event associated with the system; and
perform the operation on at least one gate associated with the at least one target block to prevent access to each of the blocks of non-volatile memory cells coupled to the common bit line in the target plane prior to completion of the power-up event.

20. The system of claim 15, wherein the controller is configured to reenable access to the each of the blocks of non-volatile memory cells coupled to the common bit line in the target plane responsive to receipt of signaling indicative of a vendor specific access code.

\* \* \* \* \*